(12) United States Patent
Meyer et al.

(10) Patent No.: US 9,219,034 B2
(45) Date of Patent: Dec. 22, 2015

(54) SEMICONDUCTOR MODULE HAVING DEFLECTING CONDUCTIVE LAYER OVER A SPACER STRUCTURE

(75) Inventors: Thorsten Meyer, Regensburg (DE); Grit Sommer, Grafing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/448,583

(22) Filed: Apr. 17, 2012

(65) Prior Publication Data

US 2012/0199990 A1   Aug. 9, 2012

Related U.S. Application Data

(62) Division of application No. 11/686,222, filed on Mar. 14, 2007, now Pat. No. 8,178,965.

(51) Int. Cl.
*H01L 21/4763* (2006.01)
*H01L 23/525* (2006.01)
*H01L 23/522* (2006.01)
(Continued)

(52) U.S. Cl.
CPC .......... *H01L 23/525* (2013.01); *H01L 23/3114* (2013.01); *H01L 23/522* (2013.01); *H01L 23/5223* (2013.01); *H01L 23/5227* (2013.01); *H01L 23/5228* (2013.01); *H01L 24/24* (2013.01); *H01L 24/12* (2013.01); *H01L 2224/0401* (2013.01); *H01L 2224/05552* (2013.01); *H01L 2224/0603* (2013.01); *H01L 2224/06102* (2013.01); *H01L 2224/1403* (2013.01); *H01L 2224/16* (2013.01); *H01L 2224/24011* (2013.01); *H01L 2224/76155* (2013.01); *H01L 2224/82102* (2013.01); *H01L 2924/014* (2013.01); *H01L 2924/01005* (2013.01); *H01L 2924/01013* (2013.01); *H01L 2924/01029* (2013.01); *H01L 2924/01033* (2013.01); *H01L 2924/01078* (2013.01); *H01L 2924/13091* (2013.01); *H01L 2924/14* (2013.01); *H01L 2924/1461* (2013.01); *H01L 2924/19041* (2013.01); *H01L 2924/19042* (2013.01); *H01L 2924/3025* (2013.01); *H01L 2924/30107* (2013.01)

(58) Field of Classification Search
CPC ....................................................... H01L 23/522
USPC .................. 257/700, 701, E21.506, E21.507; 438/612, 622, 623, 669
See application file for complete search history.

(56) References Cited

U.S. PATENT DOCUMENTS

| 4,740,700 A | 4/1988 | Shaham et al. |
| 4,863,806 A | 9/1989 | Merrick et al. |

(Continued)

FOREIGN PATENT DOCUMENTS

| DE | 10 2004 035 080 A1 | 12/2005 |
| WO | WO 2005/055310 A2 | 6/2005 |

OTHER PUBLICATIONS

Brunnbauer, M., et al., "Embedded Wafer Level Ball Grid Array (eWLB)," IEEE, Electronics Packaging Technology Conference, 2006, pp. 1-5.

*Primary Examiner* — Robert Huber
(74) *Attorney, Agent, or Firm* — Slater & Matsil, L.L.P.

(57) ABSTRACT

A module includes a semiconductor chip and a conductive layer arranged over the semiconductor chip. The module also includes a spacer structure arranged to deflect the conductive layer away from the semiconductor chip.

29 Claims, 4 Drawing Sheets

(51) Int. Cl.
*H01L 23/31* (2006.01)
*H01L 23/00* (2006.01)

(56) References Cited

U.S. PATENT DOCUMENTS

| | | | |
|---|---|---|---|
| 5,075,759 A * | 12/1991 | Moline | 257/692 |
| 5,365,192 A | 11/1994 | Wagner et al. | |
| 5,376,909 A | 12/1994 | Nelson et al. | |
| 5,994,766 A | 11/1999 | Shenoy et al. | |
| 6,180,995 B1 | 1/2001 | Hebert | |
| 6,433,427 B1 | 8/2002 | Wu et al. | |
| 6,640,402 B1 | 11/2003 | Vooren et al. | |
| 6,737,727 B2 | 5/2004 | Gates et al. | |
| 6,809,020 B2 * | 10/2004 | Sakurai et al. | 438/613 |
| 6,897,568 B2 | 5/2005 | Haimerl et al. | |
| 2004/0104754 A1 | 6/2004 | Bruchhaus et al. | |
| 2004/0137660 A1 | 7/2004 | Murata | |
| 2004/0183209 A1 | 9/2004 | Lin | |
| 2004/0262758 A1 | 12/2004 | Hashimoto | |
| 2005/0017346 A1 | 1/2005 | Yamagata | |
| 2005/0170634 A1 | 8/2005 | Lin | |
| 2005/0275085 A1 | 12/2005 | Brintzinger et al. | |
| 2007/0076060 A1 | 4/2007 | Weaver et al. | |

\* cited by examiner

SEMICONDUCTOR MODULE HAVING DEFLECTING CONDUCTIVE LAYER OVER A SPACER STRUCTURE

This is a divisional application of U.S. application Ser. No. 11/686,222, entitled "Semiconductor Module Having Deflecting Conductive Layer Over a Spacer Structure," which was filed on Mar. 14, 2007, and is hereby incorporated herein by reference.

TECHNICAL FIELD

This invention relates to a semiconductor module.

BACKGROUND

Semiconductor modules include one or more semiconductor chips having internal structures that contain active and possibly passive components. Such semiconductor modules may further include components external to the semiconductor chip(s). During operation of the semiconductor module there may occur electromagnetic interactions between the internal components of the semiconductor chip(s) and the external components. Such interactions may result in a decrease of the performance of the semiconductor module.

BRIEF DESCRIPTION OF THE DRAWINGS

Aspects of the invention are made more evident by way of example in the following detailed description of embodiments when read in conjunction with the attached figures, wherein.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Modules described in the following comprise one or more semiconductor chips. The semiconductor chip may include an integrated circuit that comprises active semiconductor devices and may additionally comprise passive components. For instance, the integrated circuit may be an analog, digital or mixed signal circuit and may implement various functions, among them digital signal processing, signal amplification, active filtering, demodulation, mixing, analog-to-digital conversion, digital-to-analog conversion, etc. The integrated circuit may implement sensor or actuator structures, e.g., in form of a MEMS (Micro-Electrical Mechanical Systems) device. Specifically, the semiconductor chip may comprise functional areas operating at radio frequency.

Modules described herein further comprise a conductive layer arranged over the semiconductor chip. The conductive layer may be used for an electrical connection between the semiconductor chip and possible external applications. Possible conductive layers may, for example, comprise one-dimensional conductive lines. Applicable materials for the fabrication of the conductive layer are, e.g., metals, metal alloys or organic conductors.

Modules described herein further comprise a spacer structure arranged to deflect the conductive layer away from the semiconductor chip. The spacer structure may be made of arbitrary non-conducting materials, for example, an inorganic or organic dielectric material, such as polyimide, or a dielectric material with a preferably low value of its dielectric constant (low-k material). Other possibilities are printing ink or photoresist materials. Moreover, the spacer structure may be of optional shape or geometric form, thereby covering any desired region of the semiconductor chip. The spacer structure may or may not contact the semiconductor chip or the conductive layer directly.

Modules described herein may further comprise one or more dielectric layers, which may be made of many organic or inorganic dielectric materials. The dielectric materials may have a low value of their dielectric constant. The dielectric layers may be composite structures manufactured out of multiple materials.

Modules described herein may further comprise a mold compound or package that laterally adjoins the semiconductor chip or in which the semiconductor chip is embedded. The mold compound may, for example, be made of a thermoplastic resin or a thermosetting plastic, for example, epoxy resin.

Figure 1:
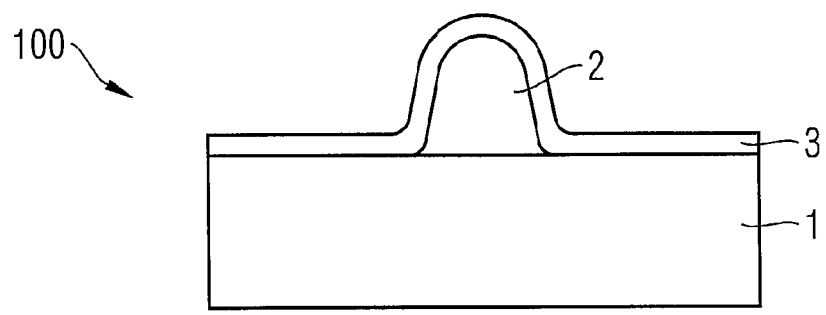
FIG. 1 shows a sectional side view of a first module.

In the following, identical or corresponding parts of the drawings are denoted by the same reference signs. FIG. 1 shows a sectional side view of a module 100 representing a first embodiment. The module 100 comprises a semiconductor chip 1, a spacer structure 2 arranged on the semiconductor chip 1 and a conductive layer 3 arranged on both the semiconductor chip 1 and the spacer structure 2. Due to the spacer structure 2 arranged between the semiconductor chip 1 and the conductive layer 3, the conductive layer 3 is deflected away from the semiconductor chip 1.

In FIG. 1, internal structures of the semiconductor chip 1 are not shown. However, it is known to a person skilled in the art that semiconductor chips may comprise passive components (such as, for example, inductors, resistors or capacitors) and active components (such as, for example, transistors or operational amplifiers). These components are comprised in a region of the semiconductor chip 1, which is usually referred to as an active region.

The conductive layer 3 may, for example, have the function of a redistribution layer, i.e., a layer providing an electrical connection between the semiconductor chip 1 and possible external applications, which are likewise not explicitly shown in FIG. 1. The conductive layer may contain passive components (such as inductors, resistors or capacitors). These passive components may be embedded in the conductive layer 3, for example, an inductor may be realized by a coil-shaped conductive line. Such "embedded passives" may, for example, be fabricated by thin-film technology (e.g., using sputtering and/or plating).

During the operation of the module 100, electromagnetic coupling between the active and/or passive components of the active region of the semiconductor chip 1 and the passive components of the conductive layer 3 may occur. In case of the semiconductor chip 1 comprising functional areas working at radio-frequency, there may also occur coupling between active and/or passive elements and radio-frequency sensitive conduction lines in the conductive layer 3. Coupling may cause cross-talk of electric signals between different components.

Such coupling may decrease the performance of the involved components, which in turn may result in a decrease of the overall performance of the module 100. In general, coupling may alter the characteristic operational parameters of the module 100 in a way that is not desired by the designer. If a conductive layer 3 is routed at a distance of about 8 μm over an embedded inductor contained in the semiconductor chip 1, the inductance of an inductor of the semiconductor chip 1 is decreased from about 10 nH to about 6.5 nH. Moreover, the resonance frequency is shifted and the quality factor is reduced from about 15 to about 7. Note that such effects may occur for components in the semiconductor chip 1 as well as for components in the conductive layer 3. The coupling may occur between active and passive components, but also between components of the same type, i.e., the combinations passive-passive or active-active.

One possibility to circumvent such coupling effects is to avoid critical areas in the semiconductor chip 1 and the conductive layer 3 to meet each other, i.e., to avoid the overlap of involved components. As critical areas of the semiconductor chip 1 and the conductive layer 3 are typically not engaging the whole semiconductor chip area, it may be possible to avoid or reduce coupling effects by choosing an appropriate geometric design of the conductive layer 3 that guarantees the same not to run over critical areas of the semiconductor chip 1 or by changing the design of the semiconductor chip 1. However, these approaches are expensive because they increase the required die area and may further be limited by design constraints.

According to FIG. 1, due to the spacer structure 2 arranged between the semiconductor chip 1 and the conductive layer 3, the distance between the semiconductor chip 1 and the conductive layer 3 is increased at relevant locations. Thereby the coupling between internal semiconductor chip components and components external to the semiconductor chip and its undesired effects on the performance of the module 100 are decreased. This allows to route the conductive layer 3 directly over critical areas in the semiconductor chip 1, i.e., allows to use this otherwise "forbidden" chip area for signal routing purposes by means of the conductive layer 3 or for the purpose to implement one or more passive components in the elevated zone of the conductive layer 3.

The sectional side view of the module 100 in FIG. 1 only shows a single spacer structure 2. It is, however, understood that further spacer structures designed in accordance with spacer structure 2 are provided. The number of spacer structures, their form and their dimensions in each spatial direction may depend on the layout of the active region of the semiconductor chip 1 and/or the layout of the conductive layer 3, i.e., the locations of their respective critical regions. It is also understood that the module 100 may comprise a plurality of conductive layers arranged beneath or over each other. Each of these conductive layers may comprise passive components. The spacer structure may be arranged between two different conductive layers, whereby couplings between the elevated conductive layer and the semiconductor chip as well as between the elevated conductive layer and the underlying conductive layer are decreased.

The height of the spacer structure 2 may be at least 5 μm, particularly at least 8 μm, and more particularly at least 12 μm. With regard to the coupling strength, this height adds to the usual (i.e., without spacer structure 2) distance between the conductive layer 3 and internal passive or active components of the semiconductor chip 1, which is typically about 8 μm. The lateral dimensions of the spacer structure 2 may be chosen such that the spacer structure 2 completely covers a critical region of the semiconductor chip 1, e.g., a functional area operating at radio-frequency. Thus, the lateral dimensions of the spacer structure 2 may be equal to or smaller than 700 μm, more particularly equal to or smaller than 500 μm and still more particularly equal to or smaller than 300 μm. For the case of the semiconductor chip 1 having a longer critical region, one of the corresponding lateral dimensions of the spacer structure 2 may exceed the above-mentioned values. Coupling can further be reduced with the spacer structure 2 being made of a dielectric material having a low dielectric constant. Values of the dielectric constant may be less than about 4.0 and more particularly less than about 2.5.

The conductive layer 3 may comprise one or more conductive lines that are routed above the spacer structure 2. Due to the spacer structure 2, the conductive lines are deflected away from the semiconductor chip 1, such that the distance between the semiconductor chip 1 and the lines is locally increased. The spacer structure 2 may show rounded edges. Thus, the curvature of the conductive lines (or generally the conductive layer 3) at the transitions between the semiconductor chip 1 and the spacer structure 2 is smooth and the risk of damaging the conductive lines routed over the transitions is decreased. It may further be advantageous, if the conductive lines (or generally the conductive layer 3) are deflected away from the semiconductor chip 1 at an inclination angle less than about 90 degrees, preferably at an inclination angle less than about 70 degrees. In this case, the spacer structure 2 may have a sectional shape of a trapezoid.

During the fabrication or the operation of the module 100, the same may expand or contract (for example, due to temperature changes). This may result in lateral forces acting on conductive lines or on the conductive layer 3 routed over the semiconductor chip 1 and the spacer structure 2. This leads to a risk of the conductive lines to be torn apart, which can be avoided (or minimized) by arranging the conductive lines in such a way that they linearly extend over the spacer structure 2 in a direction towards the center of the semiconductor chip 1. In this case, only longitudinal forces are acting on the conductive lines, while the lateral forces are kept small.

The spacer structure 2 may be manufactured using different techniques. A first method is stencil print processes or screen print processes. In these processes a structured stencil or screen, on which the desired position and shape of the spacer structure 2 are mapped to form openings, is arranged over the semiconductor chip 1. In a next step, the material from which the spacer structure 2 is to be formed is pressed through the openings of the stencil (screen) and deposited over the semiconductor chip 1. Then, the stencil (screen) is removed with the desired spacer structure 2 remaining over the semiconductor chip 1. The spacer structure 2 can then be hardened in a curing process. Using this process, the spacer structure 2 may be made of a printable material, in particular epoxy resin or silicone.

A second method for manufacturing the spacer structure 2 is thin-film technology processes, which are common and well-known to a person skilled in the art. In thin-film technology processes, the spacer structure 2 may be made of a photoresist material that is structured by photolithographic processes.

A third method for manufacturing the spacer structure 2 uses common ink-jet or dispense processes. This process may automatically generate the above-mentioned rounded edges of the spacer structure 2 and may also use the printable materials as mentioned above.

Figure 2:
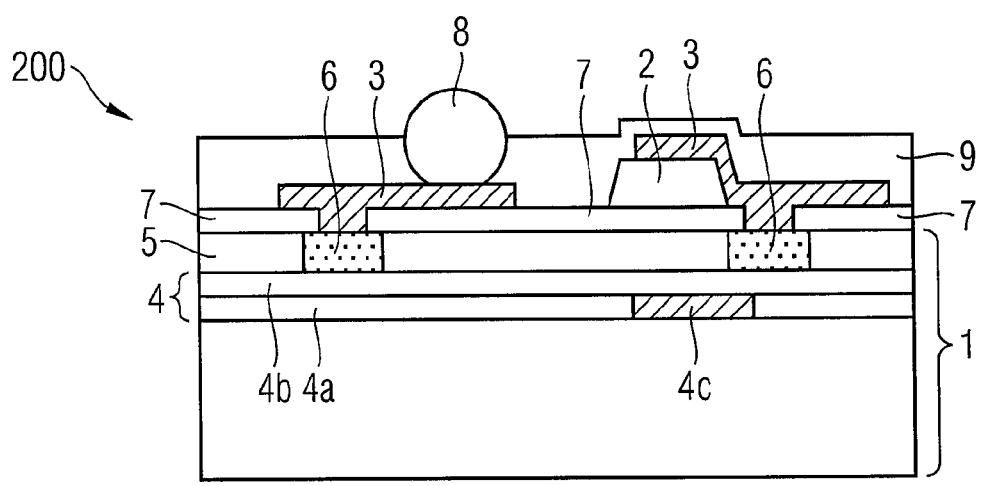
FIG. 2 shows a sectional side view of a second module.

FIG. 2 shows a sectional side view of a second module 200 representing a second embodiment. The module 200 comprises a semiconductor chip 1 and (in contrast to the module 100 shown in FIG. 1) explicitly illustrates an internal active structure 4 of the semiconductor chip 1. The active structure 4 comprises a layer 4a containing passive and/or active components and a semiconductor chip internal conductive layer 4b. The shaded area 4c of the layer 4a indicates a critical area as described above (for example, a functional area of the semiconductor chip 1 operating at radio-frequency). The semiconductor chip 1 may comprise an integrated circuit formed of the components comprised in the layer 4a. Examples for these components are inductors, resistors, capacitors or MOSFETs (Metal Oxide Semiconductor Field Effect Transistors).

To generate the active structure 4, the electronic properties of the semiconductor chip 1 may be altered by doping it with impurity atoms. The impurity atoms are incorporated into the semiconductor chip 1 at various depths and various concentrations. According to the desired functionality of the semiconductor chip 1 (respectively its integrated circuit), the components contained in the layer 4a are then electrically connected (for example, using conductive lines). The resulting conductive layer 4b bringing the electrical connection about is known as "interconnect layer" in the art. Note that this interconnect layer 4b is chip internal and has to be distinguished from the conductive layer 3 shown in FIG. 1 and FIG. 2. Typically, a plurality of such interconnect layers are provided within the semiconductor chip 1.

The module 200 further comprises a passivation layer 5, which may, for example, be made of an inorganic material, e.g., silicon nitride or silicon oxide. The passivation layer 5 is still part of the semiconductor chip 1. Embedded contact pads 6 are provided within this passivation layer 5 and are electrically connected to the active structure 4. The contact pads 6 may, for instance, be made of small aluminum or copper plates.

The module 200 further comprises a first chip external dielectric layer 7, which is deposited over the semiconductor chip 1, i.e., over the passivation layer 5. The dielectric layer 7 may be made of a dielectric material (preferably having a small dielectric constant) and may, for example, be fabricated and structured via deposition from the gas phase, lamination or thin-film technology. The dielectric layer 7 is opened at the positions of the contact pads 6. The corresponding opening procedure may, for example, be performed by a photolithographic process or an etching process.

In general the locations and the spatial dimensions of the contact pads 6 do not necessarily match the electrical contacts of external applications (e.g., a circuit board not shown in FIG. 2) to which the module 200 is to be connected. To provide this interconnection, a conductive layer 3 is arranged over the dielectric layer 7. The conductive layer 3 is usually referred to as "redistribution layer." The electrical connection to an external application may then be realized by a contact element 8. The contact element 8 may, for example, be made of a solder material in form of a ball.

The module 200 further comprises a spacer structure 2 arranged over the first dielectric layer 7. Note that the spacer structure 2 is arranged between the first dielectric layer 7 and the conductive layer 3 resulting in a deflection of the conductive layer 3 away from the semiconductor chip 1 and its active structure. The distance between the shaded critical area 4c in the layer 4a and the conductive layer 3 is thereby locally increased. The conductive layer 3 over the spacer structure 2 (i.e., arranged within the outline of the spacer structure 2) may comprise embedded passive components like inductors, resistors or capacitors.

Figure 8:
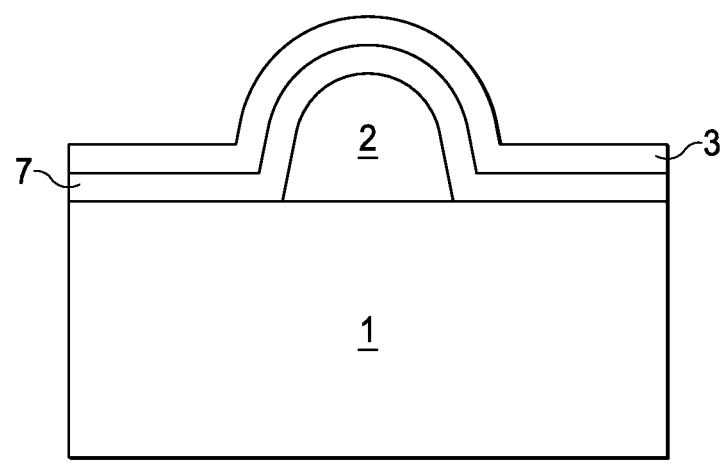
FIG. 8 shows an alternative embodiment of a sectional side view of a first module.

As illustrated in the cross sectional view of FIG. 8, the order of the first dielectric layer 7 and the spacer structure 2 may be exchanged. More specifically, the spacer structure 2 may be directly deposited on the semiconductor chip 1 and may thus be arranged in between the semiconductor chip 1 and the thin-film layers 7, 3. Also in this case, the conductive layer 3 is deflected away from the semiconductor chip 1 and coupling effects are reduced. Accordingly, the chronology of the two steps of forming the spacer structure 2 and depositing the first dielectric layer 7 may be arbitrary in general.

In some cases, however, the step of depositing the first dielectric layer 7 and the step of forming the spacer structure 2 should be carried out in a specific order. If, for example, the first dielectric layer 7 is deposited in a spinning process, the employed dielectric material is radially distributed over the semiconductor chip 1 in a centrifugal process. If the spacer structure 2 would have been formed before this centrifugal process, this would result in "blind areas" located behind the spacer structure 2, i.e., areas over which the first dielectric layer 7 cannot be distributed. Thus, if a spinning process is used to deposit the first dielectric layer 7, the spacer structure 2 should be formed afterwards. Note that there are multiple processes for the deposition of the dielectric layer 7, the forming of the spacer structure 2 and combinations thereof.

A second dielectric layer 9 is arranged over the conductive layer 3 and/or the spacer structure 2 and/or the first dielectric layer 7. The second dielectric layer 9 may, for example, be a solder stop layer used to prevent the (not yet hardened) contact element 8 to flow over other elements of the module 200. The second dielectric layer 9 may have the same properties as the above-described first dielectric layer 7.

Figure 3:
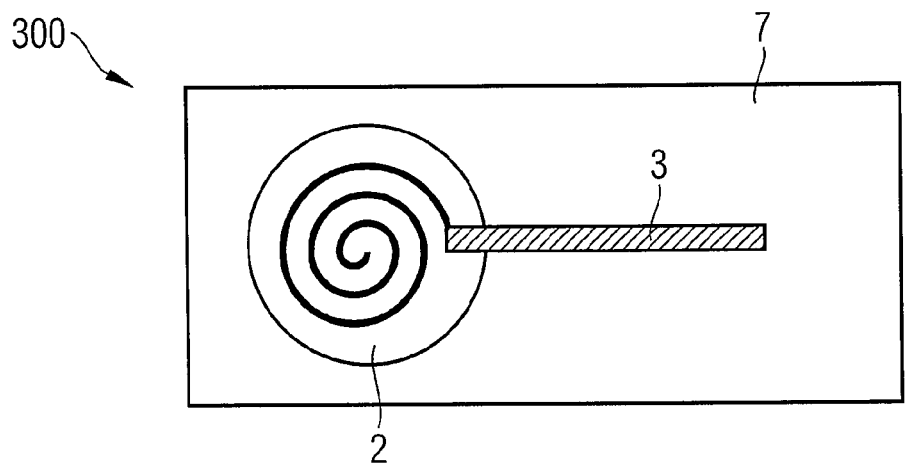
FIG. 3 shows a top plan view of a part of the second module.

FIG. 3 shows a top plan view of a sector 300 of the module 200 shown in FIG. 2. The sector 300 comprises the first dielectric layer 7 arranged over the semiconductor chip 1 (not shown due to the chosen perspective), the conductive layer 3 and the spacer structure 2. The conductive layer 3 is arranged over the first dielectric layer 7 and the spacer structure 2. In FIG. 3 the conductive layer 3 is embodied as a conductive line routed over the first dielectric layer 7 and climbing the spacer structure 2. On top of the spacer structure 2, the conductive line establishes a passive component. Here, the conductive line is circled in multiple windings resulting in an inductor of a spiral shape.

Figure 4:
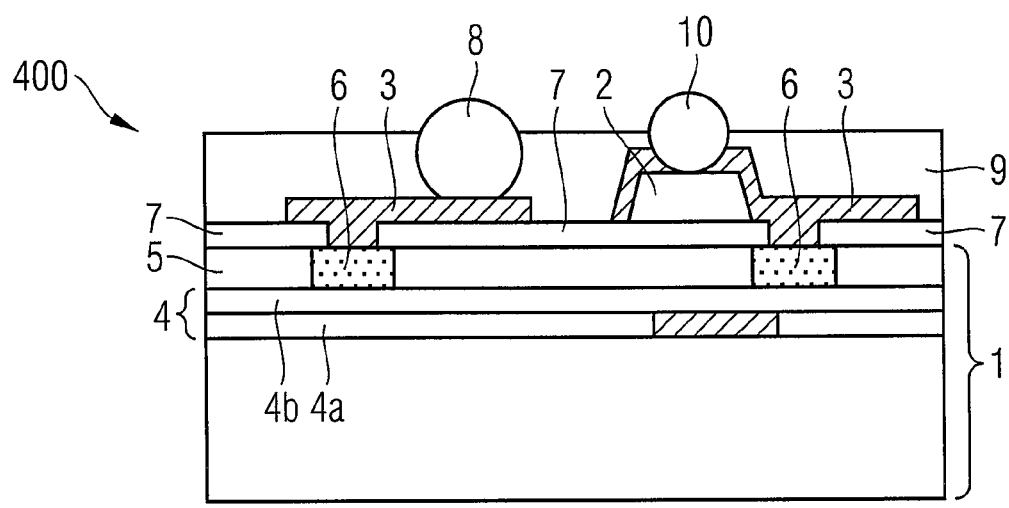
FIG. 4 shows a sectional side view of a third module.

FIG. 4 shows a sectional side view of a third module 400 as a third embodiment, wherein the module 400 is mostly similar to the module 200 shown in FIG. 2. In contrast to module 200, the conductive layer 3 on the right hand side of module 400 is opened to provide the possibility of an electrical connection between the conductive layer 3 and a further contact element 10. The conductive layer 3 may comprise an embedded passive component and accordingly the contact element 10 may directly contact the conductive layer 3 and/or the passive component comprised therein. The contact element 10 may then also be connected to a possible external application. The mentioned passive component comprised in the conductive layer 3 may, for example, be an inductor of the type shown in FIG. 3 or any other passive element.

Figure 5:
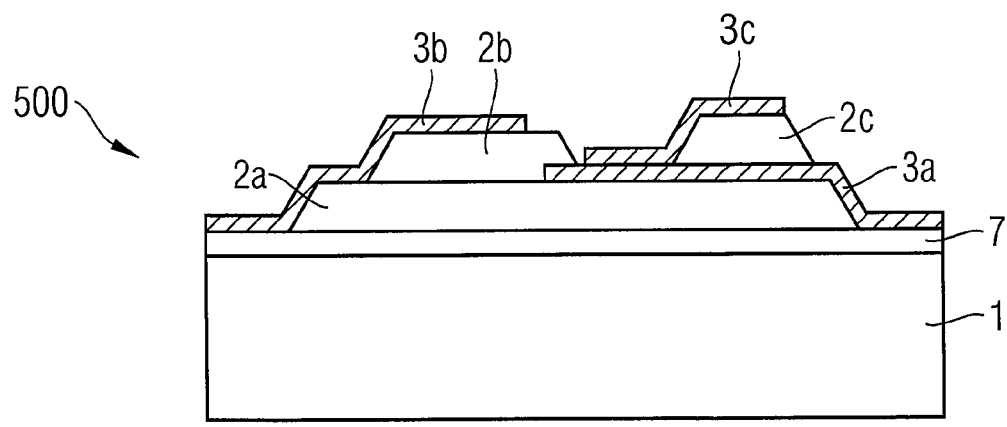
FIG. 5 shows a sectional side view of a fourth module.

FIG. 5 shows a sectional side view of a fifth module 500 as a fourth embodiment. The module 500 comprises a semiconductor chip 1 and a first dielectric layer 7 arranged over the same. Over the first dielectric layer 7 a first spacer structure 2a is arranged, which on its left and right side is covered by a first and a second conductive layer 3a and 3b, respectively. The first and second conductive layers 3a and 3b also cover the first dielectric layer 7 and may further be connected to contact pads (not explicitly shown in FIG. 5). A second spacer structure 2b is formed over the first spacer structure 2a and partly covers the first conductive layer 3a. The second spacer structure 2b itself is covered by the second conductive layer 3b. A third spacer structure 2c is arranged over the first conductive layer 3a. The third spacer structure 2c is covered by a third conductive layer 3c. On top of the spacer structures 2b and 2c, the conductive layers 3b and 3c may comprise or generate passive components. One specific example is an inductor implemented by one or more windings of a coil. In FIG. 5, the upper portion of conductive layer 3b and conductive layer 3c represent windings of a coil and conductive layer 3a and the lower portion of conductive layer 3b represent terminals of the coil. These passive components may be contacted by external contact elements, for example, the contact element 10 shown in FIG. 4, thereby providing an electrical connection between the passive component and a possible external application.

Due to the formation of more than one spacer structure, the resulting overall spacer structure (i.e., the sum of the three spacer structures 2a, 2b and 2c) may be configured to have a top surface defined by areas of at least two different heights. Overall spacer structures as shown in FIG. 5 may also be realized by a vertical splitting of or trench generation in a single spacer structure. Due to the usage of multiple spacer structures and multiple conductive layers, the module 500 provides a local screening and the possibility of multilayer redistribution.

Figure 6:
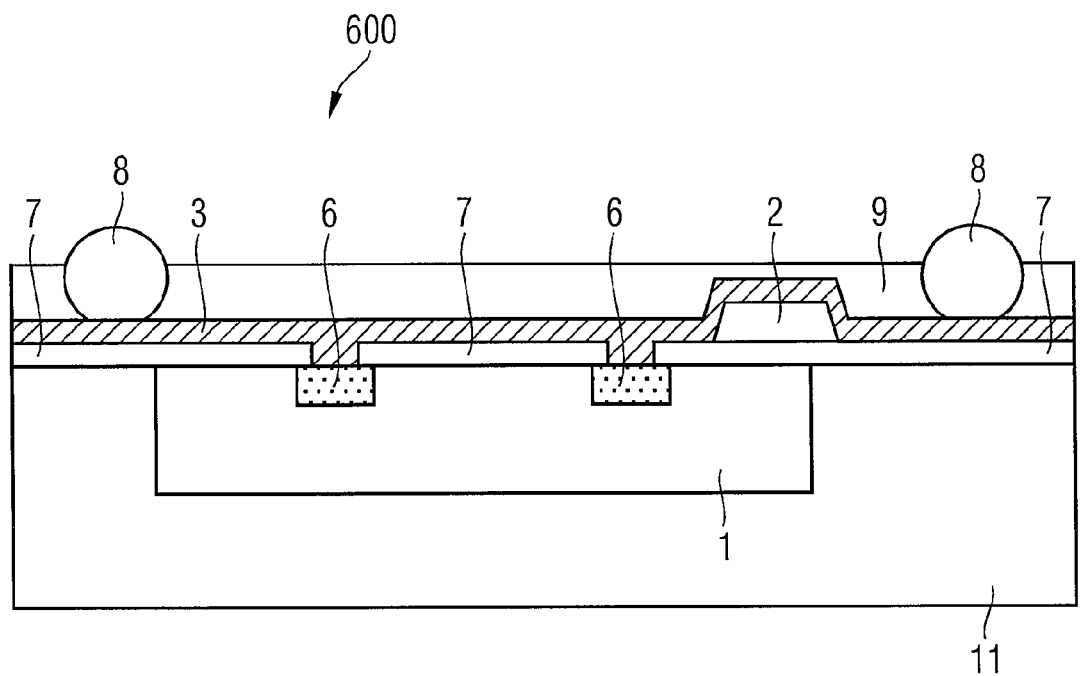
FIG. 6 shows a sectional side view of a fifth module.

FIG. 6 shows a sectional side view of a sixth module 600 representing a fifth embodiment, in which the internal structure of the semiconductor chip 1 is not explicitly shown. In contrast to the modules 200 or 400, the semiconductor chip 1 comprised in module 600 is embedded in a mold compound 11. The embedding was performed in such a way that the surface of the semiconductor chip 1 over which the first dielectric layer 7 and the conductive layer 3 are arranged, is not covered by the mold compound 11. The common overall surface of the semiconductor chip 1 and the mold compound 11 forms a common plane, on which the dielectric layer 7 is deposited. The mold compound 11 may be made of various materials like plastic materials and may have arbitrary geometric forms, particularly the form of a disc.

Due to the application of the mold compound 11, the first and second dielectric layers 7 and 9 as well as the conductive layer 3 can be extended beyond the surface of the semiconductor chip 1. Therefore, the contact elements 8 need not to be arranged directly over the semiconductor chip 1, but may extend over a larger area. Due to the mold compound 11 enlarging the surface area, the contact elements 8 may be arranged at a greater distance between each other in comparison to the contact elements 8 comprised in the modules 200 and 400 shown in FIG. 2 and FIG. 4. Further, a larger amount of contact elements 8 may be provided on the common overall surface of the semiconductor chip 1 and the mold compound 11. The spacer structure 2 again deflects the conductive layer 3 away from the semiconductor chip 1. Note that the spacer structure 2 needs not necessarily be arranged directly over the semiconductor chip 1. It may also be arranged partly or completely over the mold compound 11, i.e., beyond the outline of the semiconductor chip 1.

The embedding of the semiconductor chip 1 in the mold compound 11 may be realized by a form pressing process. During this process at least two semiconductor chips 1 are placed on an adhesive layer with their active surface (i.e., the surface comprising the contact pads 6) face-down. In a next step, the adhesive layer together with the at least two semiconductor chips 1 is placed on the flat bottom of a mold element. The mold element is open on its top side and bounded by a round boundary, which may be of wafer size. Afterwards, the viscous mold compound 11 is poured over the adhesive layer and the at least two semiconductor chips 1. A die element (preferably of the same size as the mold element) is then pressed onto the still viscous mold compound 11, such that the same is laterally distributed over the at least two semiconductor chips 1 and the adhesive layer. This step is continued until both of them are covered and the whole mold element is filled with the mold compound 11. After a hardening of the mold compound 11, the generated molded part ("big module") comprising the at least two semiconductor chips 1 is taken out of the mold element and the adhesive layer is removed. Note that the thickness of the module 600 can be controlled by simply choosing the amount of mold compound poured into the mold element. Typical values for the thickness of a module shown in FIG. 6 lie in the range of about 400 μm to about 1000 μm.

Next steps in the production of the module 600 are (amongst possible other steps): depositing the first dielectric layer 7, depositing the conductive layer 3, forming the spacer structure 2 and depositing the second dielectric layer 9. The chronology and properties of these further steps have been described above. In a last step, the big module comprising the at least two semiconductor chips 1 can be diced into multiple modules containing one or more semiconductor chips 1.

Figure 7:
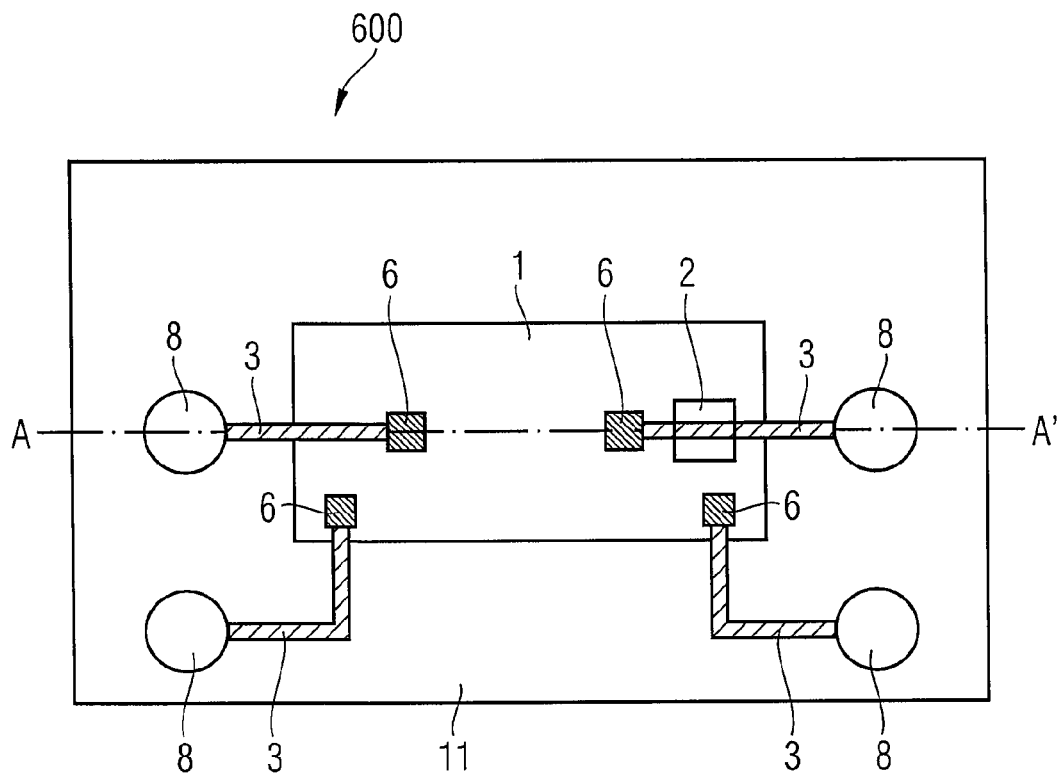
FIG. 7 shows a top plan view of the fifth module.

FIG. 7 is a top plan view of the module 600. Accordingly, the foregoing FIG. 6 represents a sectional side view of FIG. 7 along the line A-A'. The module 600 illustrates only one critical region covered by one spacer structure 2. Note, however, that multiple critical regions and multiple spacer structures are possible. FIG. 7 further shows some additional contact elements 8, which are not visible in FIG. 6.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method comprising:
    forming a spacer structure arranged to deflect a conductive layer away from a semiconductor chip, wherein at least two opposite sidewalls of the spacer structure comprise rounded edges with a centrally located convex top surface so that a transition from a major surface of the semiconductor chip to the spacer structure is smooth, wherein each of the at least two opposite sidewalls form a substantial major surface of the spacer structure;
    forming the conductive layer over the semiconductor chip, the conductive layer comprising a first and a second conductive line, wherein at least a portion of the first conductive line is formed over the spacer structure, wherein the first conductive line comprising a major surface facing away from the semiconductor chip, and wherein all portions of the second conductive line are formed below a top surface of the spacer structure, wherein the spacer structure is formed over a functional area of the semiconductor chip operating at radio frequency, wherein the conductive layer comprises a capacitor formed above the spacer structure;
    forming an external contact on the second conductive line; and forming a first dielectric layer on the conductive layer, wherein, after forming the external contact on the second conductive line, the first dielectric layer completely covers all of the major surface of the first conductive line and exposes the external contact on the second conductive line, and wherein an opposite bottom surface of the first conductive line faces the spacer structure.

2. The method according to claim 1, wherein a height of the spacer structure is at least 12 μm.

3. The method according to claim 1, wherein the spacer structure comprises a dielectric material having a dielectric constant of less than about 2.5.

4. The method according to claim 1, wherein a maximum lateral dimension of the spacer structure is equal to or smaller than about 300 μm.

5. The method according to claim 1, wherein the conductive layer is deflected away from the semiconductor chip at an angle less than about 70 degrees.

6. The method according to claim 1, further comprising depositing a second dielectric layer over the semiconductor chip before forming the conductive layer.

7. The method according to claim 6, wherein the steps of forming the spacer structure, and forming the second dielectric layer are performed on a wafer, the method further comprising:
    separating the wafer into chips;
    arranging the chips on a carrier in a spaced-apart relationship;
    covering the chips with a mold compound;
    separating the mold compound with embedded chips on the carrier; and
    thereafter, forming the conductive layer.

8. The method according to claim 7, wherein forming the conductive layer comprises:
    depositing a metal layer; and
    structuring the metal layer by a photolithographic process.

9. The method according to claim 6, wherein the forming of the spacer structure is performed before the deposition of the second dielectric layer.

10. The method according to claim 6, wherein the forming of the spacer structure is performed after the deposition of the second dielectric layer and before the formation of the conductive layer.

11. The method according to claim 1, wherein forming the spacer structure comprises:
    depositing a spacer dielectric layer; and
    structuring the spacer dielectric layer to generate the spacer structure.

12. The method according to claim 11, wherein structuring is accomplished by a photolithographic structuring process.

13. The method according to claim 1, wherein forming the spacer structure comprises depositing the spacer structure by a printing process.

14. The method according to claim 13, wherein the printing process comprises a stencil print process or a screen print process.

15. The method according to claim 13, wherein the printing process comprises an ink jet print process.

16. The method according to claim 1, further comprising structuring the conductive layer to form one or more conductive lines or a resistor or a capacitor or an inductor above the spacer structure.

17. The method according to claim 1, wherein all steps are performed on wafer level.

18. A method comprising:
    forming a spacer structure over a portion of a semiconductor chip, the portion of the semiconductor chip comprising functional areas working at radio frequencies, wherein at least two opposite sidewalls of the spacer structure comprise rounded edges with a centrally located convex top surface so that a transition from a major surface of the semiconductor chip to the spacer structure is smooth, wherein each of the at least two opposite sidewalls form a substantial major surface of the spacer structure;
    forming a conductive layer over the semiconductor chip, the conductive layer comprising a first conductive line and a second conductive line, wherein at least a portion of the first conductive line is formed over the spacer structure and the second conductive line is formed adjacent the spacer structure, and wherein all portions of the second conductive line are below a top surface of the spacer structure;
    forming a first dielectric layer on the conductive layer, the first dielectric layer completely covering an entire top surface of the first conductive line; and
    forming an external contact contacting the second conductive line through an opening in the first dielectric layer without forming any external contact contacting the first conductive line, wherein, after forming the external contact, the first dielectric layer is configured to prevent any coupling of the first conductive line with a contact element over the spacer structure.

19. The method according to claim 18, wherein the first conductive line comprises at least a portion of a capacitor.

20. The method according to claim 18, wherein the first conductive line comprises at least a portion of an inductor.

21. The method according to claim 1, wherein the first dielectric layer prevents any coupling of the first conductive line with a contact element over the spacer structure.

22. A method comprising:
    forming a spacer structure arranged to deflect a conductive layer away from a semiconductor chip, wherein at least two opposite sidewalls of the spacer structure comprise rounded edges with a centrally located convex top surface so that a transition from a major surface of the semiconductor chip to the spacer structure is smooth, wherein each of the at least two opposite sidewalls form a substantial major surface of the spacer structure;
    forming the conductive layer over the semiconductor chip, the conductive layer comprising a first and a second conductive line, wherein at least a portion of the first conductive line is formed over the spacer structure, and wherein all portions of the second conductive line are formed below a top surface of the spacer structure, wherein the spacer structure is formed over a functional area of the semiconductor chip operating at radio frequency;
    forming a first dielectric layer on the conductive layer, the first dielectric layer insulating the first conductive line completely by covering all of a top surface of the first conductive line, wherein an opposite bottom surface of the first conductive line faces the spacer structure; and
    forming an external contact coupled to the second conductive line without forming any external contact contacting the first conductive line, wherein, after forming the external contact, the first dielectric layer is configured to prevent any coupling of the first conductive line with a contact element over the spacer structure.

23. The method according to claim 22, wherein a height of the spacer structure is at least 12 μm.

24. The method according to claim 22, wherein the spacer structure comprises a dielectric material having a dielectric constant of less than about 2.5.

25. The method according to claim 22, wherein a maximum lateral dimension of the spacer structure is equal to or smaller than about 300 μm.

26. The method according to claim 22, wherein the conductive layer is deflected away from the semiconductor chip at an angle less than about 70 degrees.

27. The method according to claim 22, further comprising depositing a second dielectric layer over the semiconductor chip before forming the conductive layer.

28. The method according to claim 1, wherein the spacer structure has a height so that the distance between the first conductive line and the functional area of the semiconductor chip operating at radio frequency increases by at least 50%.

29. A method comprising:
 forming a spacer structure arranged to deflect a conductive layer away from a semiconductor chip comprising a critical functional area operating at radio frequency and a non-critical functional area, wherein at least two opposite sidewalls of the spacer structure comprise rounded edges with a centrally located convex top surface so that a transition from a major surface of the semiconductor chip to the spacer structure is smooth, wherein each of the at least two opposite sidewalls form a substantial major surface of the spacer structure;
 forming the conductive layer over the semiconductor chip, the conductive layer comprising a first and a second conductive line, wherein at least a portion of the first conductive line is formed over the spacer structure, wherein the first conductive line comprising a major surface facing away from the semiconductor chip, and wherein all portions of the second conductive line are formed below a top surface of the spacer structure, wherein the spacer structure is formed directly over the critical functional area of the semiconductor chip operating so as to overlap with the critical functional area while not overlapping with the non-critical functional area, wherein the conductive layer comprises a functional component comprising a capacitor formed above the spacer structure;
 forming an external contact on the second conductive line; and
 forming a first dielectric layer on the conductive layer, wherein, after forming the external contact on the second conductive line, the first dielectric layer completely covers all of the major surface of the first conductive line and exposes the external contact on the second conductive line, and wherein an opposite bottom surface of the first conductive line faces the spacer structure.

* * * * *